(12) United States Patent
Bellini et al.

(10) Patent No.: US 11,302,811 B2
(45) Date of Patent: Apr. 12, 2022

(54) SILICON CARBIDE POWER DEVICE WITH MOS STRUCTURE AND STRESSOR

(71) Applicant: Hitachi Energy Switzerland AG, Baden (CH)

(72) Inventors: Marco Bellini, Schlieren (CH); Lars Knoll, Hägglingen (CH); Lukas Kranz, Zürich (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/416,294

(22) PCT Filed: Dec. 16, 2019

(86) PCT No.: PCT/EP2019/085340
§ 371 (c)(1),
(2) Date: Jun. 18, 2021

(87) PCT Pub. No.: WO2020/127041
PCT Pub. Date: Jun. 25, 2020

(65) Prior Publication Data
US 2022/0045213 A1    Feb. 10, 2022

(30) Foreign Application Priority Data

Dec. 21, 2018  (EP) .................................. 18215379

(51) Int. Cl.
*H01L 29/73*     (2006.01)
*H01L 29/78*     (2006.01)
(Continued)

(52) U.S. Cl.
CPC ...... *H01L 29/7843* (2013.01); *H01L 29/1095* (2013.01); *H01L 29/1608* (2013.01); *H01L 29/7395* (2013.01); *H01L 29/7802* (2013.01)

(58) Field of Classification Search
CPC ..... H01L 29/06; H01L 29/0653; H01L 29/10; H01L 29/1095; H01L 29/16;
(Continued)

(56) References Cited

U.S. PATENT DOCUMENTS

| 5,081,513 A | 1/1992 | Jackson et al. |
| 6,586,781 B2 | 7/2003 | Wu et al. |

(Continued)

FOREIGN PATENT DOCUMENTS

| CN | 102714224 A | 10/2012 |
| CN | 103548145 A | 1/2014 |

(Continued)

OTHER PUBLICATIONS

International Search Authority, Notification of the International Search Report and the Written Opinion of the International Searching Authority, or Declaration, International App. No. PCT/EP2019/085340, dated Apr. 29, 2020, 14 pages.

*Primary Examiner* — Fazli Erdem
(74) *Attorney, Agent, or Firm* — Slater Matsil, LLP

(57) ABSTRACT

A silicon carbide power device, e.g., a vertical power MOSFET or an IGBT, includes a silicon carbide wafer. A first stressor and a second stressor are arranged in the silicon carbide wafer at a first main side. A first channel region, a first portion of a drift layer and a second channel region are laterally arranged between the first stressor and the second stressor in a second lateral direction parallel to the first main side and perpendicular to the first lateral direction. A stress can be introduced by the first stressor and the second stressor in the first channel region and in the second channel region.

18 Claims, 8 Drawing Sheets

(51) Int. Cl.
*H01L 29/16* (2006.01)
*H01L 29/739* (2006.01)
*H01L 29/10* (2006.01)

(58) Field of Classification Search
CPC . H01L 29/1608; H01L 29/73; H01L 29/7395;
H01L 29/78; H01L 29/7802; H01L
29/7842; H01L 29/7843; H01L 29/7846
USPC .......................................................... 257/77
See application file for complete search history.

(56) References Cited

U.S. PATENT DOCUMENTS

| | | | |
|---|---|---|---|
| 9,029,979 | B2 * | 5/2015 | Yoshimoto ............ H01L 29/045 257/510 |
| 2004/0232513 | A1 | 11/2004 | Chi et al. |
| 2005/0181536 | A1 | 8/2005 | Tsuji |
| 2005/0208776 | A1 | 9/2005 | Krishnan et al. |
| 2008/0251854 | A1 | 10/2008 | Shimooka et al. |
| 2011/0101375 | A1 | 5/2011 | Zhang |
| 2014/0077232 | A1 | 3/2014 | Hino et al. |
| 2015/0270353 | A1 | 9/2015 | Shimizu et al. |
| 2016/0149031 | A1 | 5/2016 | Jung |

FOREIGN PATENT DOCUMENTS

| | | |
|---|---|---|
| CN | 105161539 A | 12/2015 |
| CN | 105810722 A | 7/2016 |
| CN | 107871781 A | 4/2018 |
| JP | 2015185617 A | 10/2015 |

* cited by examiner

SILICON CARBIDE POWER DEVICE WITH MOS STRUCTURE AND STRESSOR

CROSS-REFERENCE TO RELATED APPLICATIONS

This application is a national stage application of International Application No. PCT/EP2019/076324, filed on Dec. 16, 2019, which claims priority to European Patent Application No. 18215379.1, filed on Dec. 21, 2018, which applications are hereby incorporated herein by reference.

FIELD OF THE INVENTION

The present invention relates to a silicon carbide power device comprising a MOS structure according to the preamble of claim 1.

BACKGROUND OF THE INVENTION

From US 2014/077232 A1 it is known a semiconductor device capable of suppressing time variation of a threshold voltage and a method of manufacturing the same. The semiconductor device disclosed in US 2014/077232 A1 comprises a drift layer formed on a semiconductor substrate, first well regions formed in a surface layer of the drift layer, being apart from one another, a gate insulating film formed, extending on the drift layer and each of the first well regions, a gate electrode selectively formed on the gate insulating film, a source contact hole penetrating through the gate insulating film and reaching the inside of each of the first well regions, and a residual compressive stress layer formed on at least a side surface of the source contact hole, in which a compressive stress remains.

From US 2005/181536 A1 it is known to exert stress to a SiC crystal in a region, in which carriers of a SiC semiconductor device flow, to change the crystal lattice intervals of the SiC crystal. Since the degeneration of the conduction bands in the bottoms thereof is dissolved, since the interband scattering is prevented from causing, and since the effective electron mass is reduced due to the crystal lattice interval change, the carrier mobility in the SiC crystal is improved, the resistance of the SiC crystal is reduced and, therefore, the on-resistance of the SiC semiconductor device is reduced.

According to US 2008/251854 A1 a silicon semiconductor device may include a p-channel semiconductor active region, an n-channel semiconductor active region, an element isolation insulating layer which electrically isolates the p-channel semiconductor active region from the n-channel semiconductor active region, and an insulating layer made of a material different from that of the element isolation insulating layer, and being in contact with both ends, in its channel length direction, of the p-channel semiconductor active region to apply a compression stress in the channel length direction to a channel of the p-channel semiconductor active region, wherein the p-channel semiconductor active region is surrounded by the insulating layer, which is in contact with the both ends, in the channel length direction, of the p-channel semiconductor active region, and the p-channel semiconductor active region is surrounded by the element isolation insulating layer, which is in contact with the side surfaces, approximately parallel to the channel length direction, of the p-channel semiconductor active region, and the n-channel semiconductor active region is surrounded by the element isolation insulating layer.

Power semiconductor devices are used as switches controlling the current flow through various electronic systems. Many of these known power semiconductor devices make use of a metal-oxide-semiconductor (MOS) structure. Devices that comprise a MOS structure are for example a power MOS field-effect transistor (MOSFET) designed to handle significant power levels or an insulated-gate bipolar transistor (IGBT). Power MOSFETs are available in various different configurations, the most common configurations being the vertical power MOSFET, the lateral power MOSFET, the tri-gated MOSFET and the gate-all-around MOSFET. While silicon (Si) is the most common and well understood semiconductor material for power semiconductor devices, silicon carbide (SiC) offers a number of attractive characteristics for high-voltage power semiconductors when compared to commonly used silicon (Si). Exemplarily the much higher breakdown field strength and a high thermal conductivity of SiC allow creating devices which outperform by far the corresponding Si devices, and enable reaching otherwise unattainable efficiency levels. SiC MOSFETs offer superior dynamic performance over conventional Si power MOSFETs. On the other side traps at the interface between SiC and the gate insulating layer as well as traps in the first few nanometers of the SiC material below the gate insulating layer dramatically affect the behavior of the SiC based MOSFET devices. In particular the afore-mentioned traps modify the threshold voltage, reduce the steepness of the subthreshold slope, increase leakage in the off-state and reduce the amount of current in the on-state. Efforts in the prior art focus on avoiding such traps at or close to the interface between the gate insulation layer and the SiC material of a channel region below.

SUMMARY OF THE INVENTION

In view of the above disadvantages in the prior art it is an object of the invention to provide a silicon carbide power device comprising a MOS structure that can overcome the above-mentioned detrimental effects of traps at an interface between SiC and a gate insulating layer as well as in the first few nanometers of SiC below the gate insulating layer in a most efficient manner.

The object of the invention is attained by the silicon carbide power device according to claim 1. Further developments of the invention are specified in the dependent claims.

A silicon carbide power device which is a vertical power MOSFET or an IGBT, comprises a silicon carbide wafer having a first main side and a second main side opposite to the first main side, the silicon carbide wafer comprising: a first channel region of a first conductivity type, a first source region of a second conductivity type different from the first conductivity type, a drift layer of the second conductivity type, a first base layer of the first conductivity type, a second source region of the second conductivity type, a second channel region of the first conductivity type and a second base layer of the first conductivity type. The first source region is arranged on a first lateral side of the first channel region in a first lateral direction parallel to the first main side. A first portion of the drift layer is arranged on a second lateral side of the first channel region, wherein the second lateral side is opposite to the first lateral side, and a second portion of the drift layer extends from the first portion towards the second main side. The first base layer separates the first source region from the drift layer. The second channel region is arranged on the second lateral side of the first channel region and is laterally separated from the first channel region by the first portion of the drift layer. The second source region and the first portion of the drift layer are arranged on opposite lateral sides of the second channel. The second base layer separates the second source region from the drift layer. The silicon carbide power device comprises a gate insulation layer, a conductive gate layer, a first stressor and a second stressor. The gate insulation layer is arranged to extend on the first main side to overlap the first channel region and the second channel region, wherein the gate insulation layer is directly on the first channel region and on the second channel region. The gate layer is directly on the gate insulation layer, so that the gate layer is separated from the first channel region and from the second channel region by the gate insulation layer. The first stressor and the second stressor are arranged in the silicon carbide wafer at the first main side. The first channel region, the first portion of the drift layer and the second channel region are laterally arranged between the first stressor and the second stressor in a second lateral direction parallel to the first main side and perpendicular to the first lateral direction, such that a stress is introduced by the first stressor and the second stressor in the first channel region and in the second channel region.

The silicon carbide (SiC) power device of the invention comprises a first MOS structure which includes a silicon carbide first channel region of a first conductivity type, the gate insulation layer directly on the first channel region, and the conductive gate layer directly on the gate insulation layer. The silicon carbide power device of the invention comprises a second MOS structure, which includes a silicon carbide second channel region of the first conductivity type, the gate insulation layer directly on the second channel region, and the conductive gate layer directly on the gate insulation layer. The first stressor and the second stressor are configured to introduce stress in the first and second channel region. It is to be noted that throughout the specification stress applied to a material is the force per unit area applied to the material. Tensile stress means that the material is under tension. In this case the forces acting on it are trying to stretch the material. On the other side, compressive stress means that the material is under compression. In this case the forces acting on an object are trying to squash it. Stress is calculated as a force per unit area. Accordingly, the SI unit of stress is Pascal (Pa). The term MOS structure is to be understood by a skilled person in a broad non-literal sense such that it does not necessarily require the gate layer to be made of a metal and does also not necessarily require the gate insulation layer to be made of an oxide. The gate layer can be made of any kind of electrically conductive material and the gate insulation layer can be made of any kind of dielectric insulating material. Devices having a gate insulation layer different from an oxide layer may also be called MIS (metal-insulator-semiconductor) devices. The term MOS device/MOSFET shall also cover such MIS devices/MISFETs and applies also for IGBTs which are MOS/MIS-controlled.

By applying stress in the first and second channel region energy levels of traps present at the interface between the gate insulation layer and the first and second channel regions are pushed into the conduction band and do, therefore, not negatively affect the device characteristics. For example, if the concept of the invention is applied to a SiC power MOSFET, the stress introduced in the first and the second channel region by the first and second stressor results in a steeper subthreshold regime, reduced threshold voltage degradation due to traps, reduced Coulomb scattering and improved electronic mobility in the first and second channel region, compared to a vertical SiC power MOSFET without stressor.

In an exemplary embodiment the gate insulation layer is a silicon oxide layer. In such exemplary embodiment the detrimental effects of traps present at the SiC/silicon oxide interface under the gate layer can be pushed into the conduction band most efficiently due to the fact that such traps are relatively close to the conduction band.

In an exemplary embodiment the first stressor is either in direct contact with the first channel region or is connected to the first channel region by a continuous silicon carbide region. The first stressor can introduce stress in the first channel region most efficiently in this exemplary embodiment.

In an exemplary embodiment the material of the first stressor is one of the following: an oxide, a nitride, such as silicon nitride (SiN) or aluminum nitride or a ceramic compound. These materials are especially suitable for introducing stress in the first channel region.

In an exemplary embodiment the first stressor is electrically non-conductive. In such exemplary embodiment it can be avoided that current flows through the first stressor to affect current flow in the device.

In an exemplary embodiment the stress in the first channel region has an absolute value that is at least 0.5 GPa. With this minimum stress in the first channel layer the traps can efficiently be pushed into the conduction band.

In an exemplary embodiment the distance between the first stressor and the first channel region is less than 10 µm or less than 5 µm or less than 2.5 µm. the closer the first stressor is to the first channel region, the more efficiently can stress be introduced in the first channel region.

In an exemplary embodiment the first stressor extends from the first main side to a depth of at least 50 nm, extends at least 100 nm in a first lateral direction (i.e. the first stressor has a first width in the first lateral direction of at least 100 nm) and extends at least 100 nm in a second lateral direction perpendicular to the first lateral direction (i.e. the first stressor has a second width in the second lateral direction of at least 100 nm). Providing the first stressor with the before mentioned minimum dimensions and being embedded in the silicon carbide wafer allows to most efficiently introduce stress in the first channel region.

In an exemplary embodiment the first stressor and the second stressor may be in direct contact with the first channel region, the first portion of the drift layer and the second channel region. In this exemplary embodiment stress can be introduced in the first channel region most efficiently by the direct contact between the first and the second stressors and the first channel region, the first portion of the drift layer and the second channel region.

In an exemplary embodiment the first channel region, the second channel region, the first stressor and the second stressor are arranged in a configuration with mirror symmetry relative to a plane perpendicular to the first main side and extending between the first channel region and the second channel region. With such mirror symmetry the stress can be introduced in the first and the second channel region homogeneously.

BRIEF DESCRIPTION OF THE DRAWINGS

Detailed embodiments of the invention will be explained below with reference to the accompanying figures, in which.

The reference signs used in the figures and their meanings are summarized in the list of references signs. Generally, similar elements have the same reference signs throughout the specification. The described embodiment and the comparative examples are meant as examples and shall not limit the scope of the invention.

DETAILED DESCRIPTION OF COMPARATIVE EXAMPLES AND AN EXEMPLARY EMBODIMENT

Figure 1A:
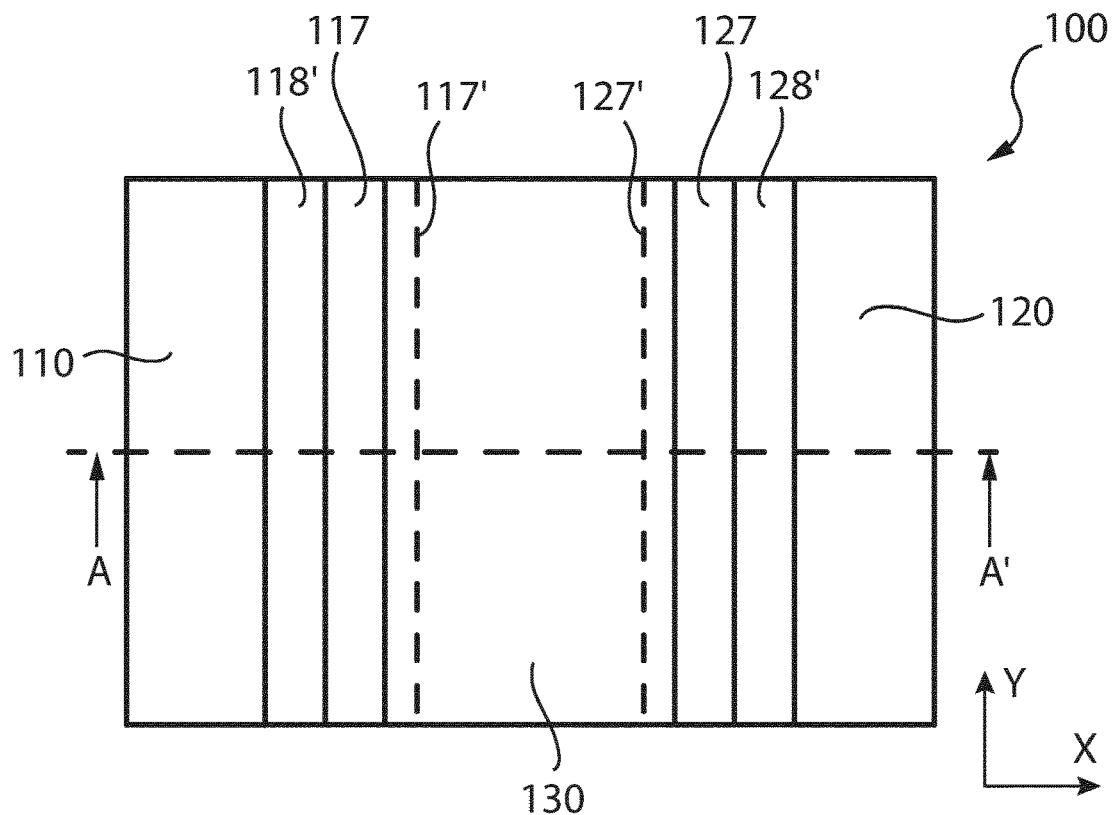
FIG. 1A shows a silicon carbide power device according to a first comparative example in top view.
Figure 1B:
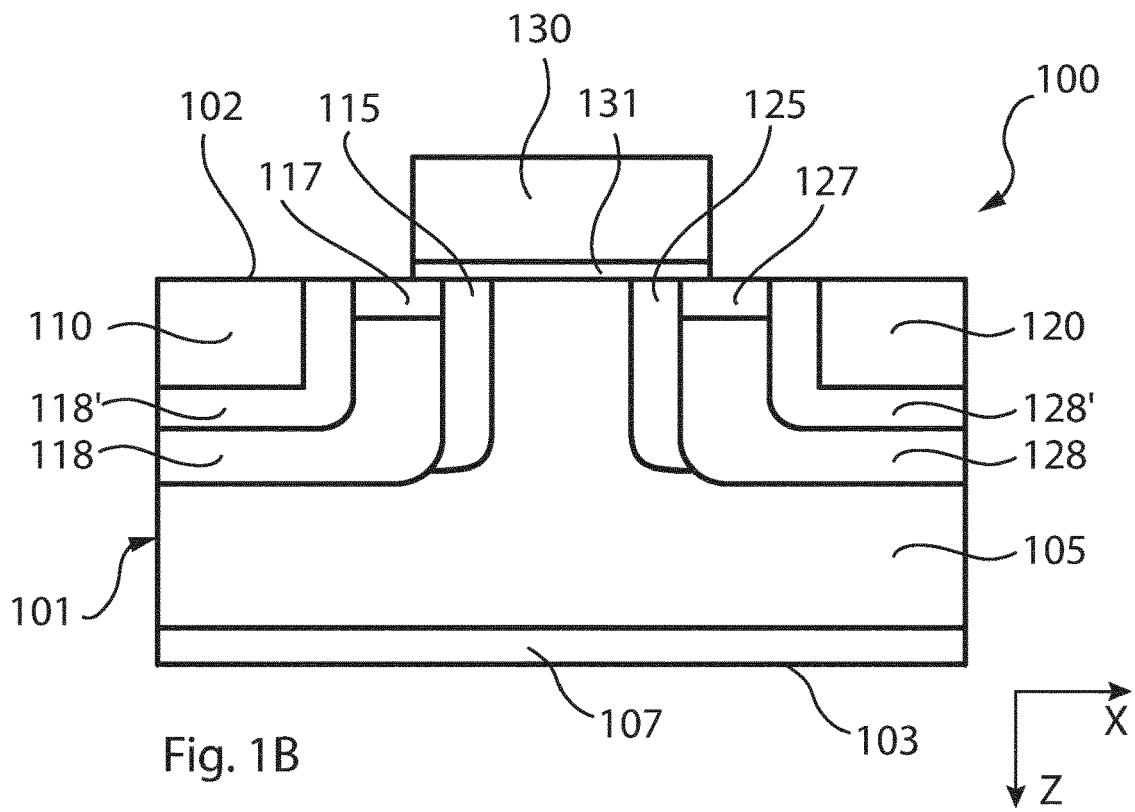
FIG. 1B shows the silicon carbide power device according to the first comparative example in cross-section taken along line A-A' in FIG. 1A.

In the following there is described a silicon carbide (SiC) power device according to a first comparative example with reference to FIGS. 1A and 1B. FIG. 1A shows a top view of the SiC power device according to the first comparative example and FIG. 1B shows a cross-section taken along line A-A' in FIG. 1A. The SiC power device according to the first comparative example is a vertical power MOSFET 100, which comprises a SiC wafer 101 having a first main side 102 and a second main side 103 opposite to the first main side 102 as shown in the cross-section of FIG. 1B. The SiC wafer 101 comprises adjacent to the first main side 102 an n-type first source region 117, a p-type first channel region 115, an n-type drift layer 105, a p-type second channel region 125, and an n-type second source region 127.

The first source region 117 is arranged on a first lateral side of the first channel region 115 in a first lateral direction X. Throughout the specification the term "laterally" relates to any lateral direction being a direction parallel to the first main side 102. The drift layer 105 and the second channel region 125 are both arranged on a second lateral side of the first channel region in the first lateral direction X, wherein the second lateral side is opposite to the first lateral side. A first portion of the drift layer 105 is arranged laterally between the first channel region 115 and the second channel region 125 in the first lateral direction X. That is the first portion of the drift layer 105 separates the first channel region 115 from the second channel region 125 in the first lateral direction X. A second portion of the drift layer 105 extends in an orthogonal direction Z from the first portion of the drift layer towards the second main side of the SiC wafer 101, wherein the orthogonal direction Z is a direction perpendicular to the first main side 102. A p-type first base layer 118 is formed as a well region in the SiC wafer 101 adjacent to the first main side 102 to separate the first source region 117 from the drift layer 105. More specifically, the first base layer 118 and the first channel region 115 surround the first source region 117 to separate it from the drift layer 105. Likewise, a p-type second base layer 128 is formed as a well region in the SiC wafer 101 adjacent to the first main side 102 to separate the second source region 127 from the drift layer 105. More specifically, the second channel region 125 and the second base layer 128 surround the second source region 127 to separate it from the drift layer 105. A gate insulation layer 131 is arranged on the first main side 102 of the SiC wafer 101 to overlap the first channel region 115, the second channel region 125 and the first portion of the drift layer 105 which is laterally arranged between the first channel region 115 and the second channel region 125. A gate layer 130 is formed directly on the gate insulation layer 131 to be separated from the SiC wafer 101 only by the gate insulation layer 131. At the second main side 103 of the SiC wafer 101 an $n^+$-type drain layer 107 is arranged. The gate layer 130 may be formed of any electrically conductive material such as metal or conductive polysilicon. The gate insulation layer 131 may be formed of silicon oxide or any other suitable dielectric material that is electrically insulating.

Throughout the specification, if a region is specified to be "$n^+$-type", it shall be interpreted in such way that such region has a higher n-type doping concentration than any layer or region specified to be "n-type". Likewise, it a region is specified to be "$p^+$-type", it shall be interpreted in such way that such region has a higher p-type doping concentration than any layer or region specified to be "p-type".

The first channel region 115 together with a portion of the gate insulation layer 131 and a portion of the gate layer 130 that overlap the first channel region 115 in top view (i.e. in an orthogonal projection onto a plane parallel to the first main side 102) form a first MOS structure at the first main side 102, while the second channel region 125, together with another portion of the gate insulation layer 131 and another portion of the gate layer 130 that overlap the second channel region 125 in top view form a second MOS structure laterally adjacent to the first MOS structure.

The first p-type base layer 118 includes a highly doped first $p^+$-base layer portion 118', which is formed as a well region adjacent to the first main side 102. Likewise, a highly doped second $p^+$-base layer portion 128' is included in the second base layer 128 and formed as a well region adjacent to the first main side 102. The first source region 117 and the first $p^+$-base layer portion 118' are to be contacted by a first source electrode (not shown in the figures). Likewise, the second source region 127 and the second $p^+$-base layer portion 128' is to be contacted by a second source electrode (not shown in the figures). The drain layer 107 is to be contacted by a drain electrode (not shown in the figures).

The vertical power MOSFET 100 includes a first stressor 110 and a second stressor 120 arranged adjacent to the first main side 102 to be embedded in the SiC wafer 101. Specifically, the first stressor 110 is embedded in the first $p^+$-base layer portion 118' and the second stressor 120 is embedded in the second p$^+$-base layer portion 128'. The first stressor 110 and the second stressor 120 are configured to introduce stress in the first channel region 117 and in the second channel region 127. The first stressor 110 is connected to the first channel region 115 by a continuous silicon carbide region, namely by a portion of the first base layer 118, in particular a portion of the first p$^+$-base layer portion 118', and by the first source region 117 arranged between the first channel region 115 and the first stressor 110. A lateral distance between the first stressor 110 and the first channel region 115 is exemplary less than 10 μm or less than 5 μm or less than 2.5 μm. The stress in the first channel region 115 is substantially aligned in a direction parallel to a direction of current flow through the first channel region 115 during operation of the vertical power MOSFET 100, i.e. parallel or anti-parallel to the first lateral direction X.

Likewise, the second stressor 120 is connected to the second channel region 125 by a continuous SiC region, namely by a portion of the second base layer 128, in particular a portion of the second p$^+$-base layer portion 128', and the second source region 127, which are arranged in the second channel region 125 and the second stressor 120. A lateral distance between the second stressor 120 and the second channel region 125 (in the first lateral direction X) is exemplary less than 10 μm or less than 5 μm or less than 2.5 μm. The stress in the second channel region 125 is substantially aligned in a direction parallel to a direction of current flow through the second channel region 125 during operation of the vertical power MOSFET 100, i.e. parallel or anti-parallel to the first lateral direction X.

The material of the first stressor 110 and of the second stressor 120 may be any one of the following: an oxide, a nitride, such as silicon nitride (SiN) or aluminum nitride (AlN) or a ceramic compound. These materials are especially suitable for introducing stress in a SiC layer. The material of the first stressor 110 and of the second stressor 120 is exemplarily electrically non-conductive. It is to be noted that suitable materials and techniques for forming a stressor from such suitable materials in silicon based semiconductor devices are well known to persons skilled in the art. Similar materials and techniques may be used for forming stressors in SiC based devices.

It is to be noted that part of the stress in the first channel region 115 might also be introduced by the second stressor 120 and that part of the stress in the second channel region 127 might also be introduced by the first stressor 110. An amount of stress in the first channel region 115 is at least 0.5 GPa, and an amount of stress in the second channel region is at least 0.5 GPa. The stressed introduced in the first and second channel regions 115 and 125 may be tensile stress.

In the first comparative example the first stressor 110 and the second stressor 120 have both a strip-shape in top view. Accordingly, the second width of the first stressor 110, may be larger than the first width thereof, and the second width of the second stressor 120 may be larger than the second width thereof. As shown in FIG. 1A each one of the first source region 115, the gate layer 130 and the second source region 127 may have a strip-shape in top view with a longitudinal axis extending in parallel along the second lateral direction Y, respectively. A lateral side 117' of the first source region 117 below the gate layer 130 and a lateral side 127' of the second source region 127 below the gate layer 130 are both indicated by a dashed line in FIG. 1A.

To efficiently introduce a sufficiently high amount of stress in the first and second channel regions 115 and 125, the first and the second stressors 110 and 120 each extend from the first main side 102 to a depth of at least 50 nm, have each a first lateral width in the first lateral direction X of at least 100 nm, and each have a second width in the second lateral direction Y perpendicular to the first lateral direction X of at least 100 nm. Exemplarily, the first and second stressors 110 and 120 may each extend from the first main side 102 to a depth of at least 100 nm or to a depth of at least 200 nm. More exemplarily, the first and second stressors 110 and 120 may each have a first lateral width in the first lateral direction X of at least 100 nm or of at least 200 nm. Exemplarily, the first and second stressors 110 and 120 may each have a second lateral width in the second lateral direction Y of at least 100 nm or of at least 200 nm.

As shown in FIGS. 1A and 1B the first channel region 115, the second channel region 125, the first stressor 110 and the second stressor 120 are arranged in a configuration with mirror symmetry relative to a first plane perpendicular to the first main side 102 and extending in the middle between the first channel region 115 and the second channel region 125 in the second lateral direction Y. In this manner a same homogenous stress level can be introduced in the first channel region 115 and in the second 125, respectively. The arrangement of the first channel region 115, the second channel region 125, the first stressor 110 and the second stressor 120 may also be arranged in a configuration with mirror symmetry relative to a second plane perpendicular to the first main side 102 and extending in the first lateral direction X.

Figure 2A:
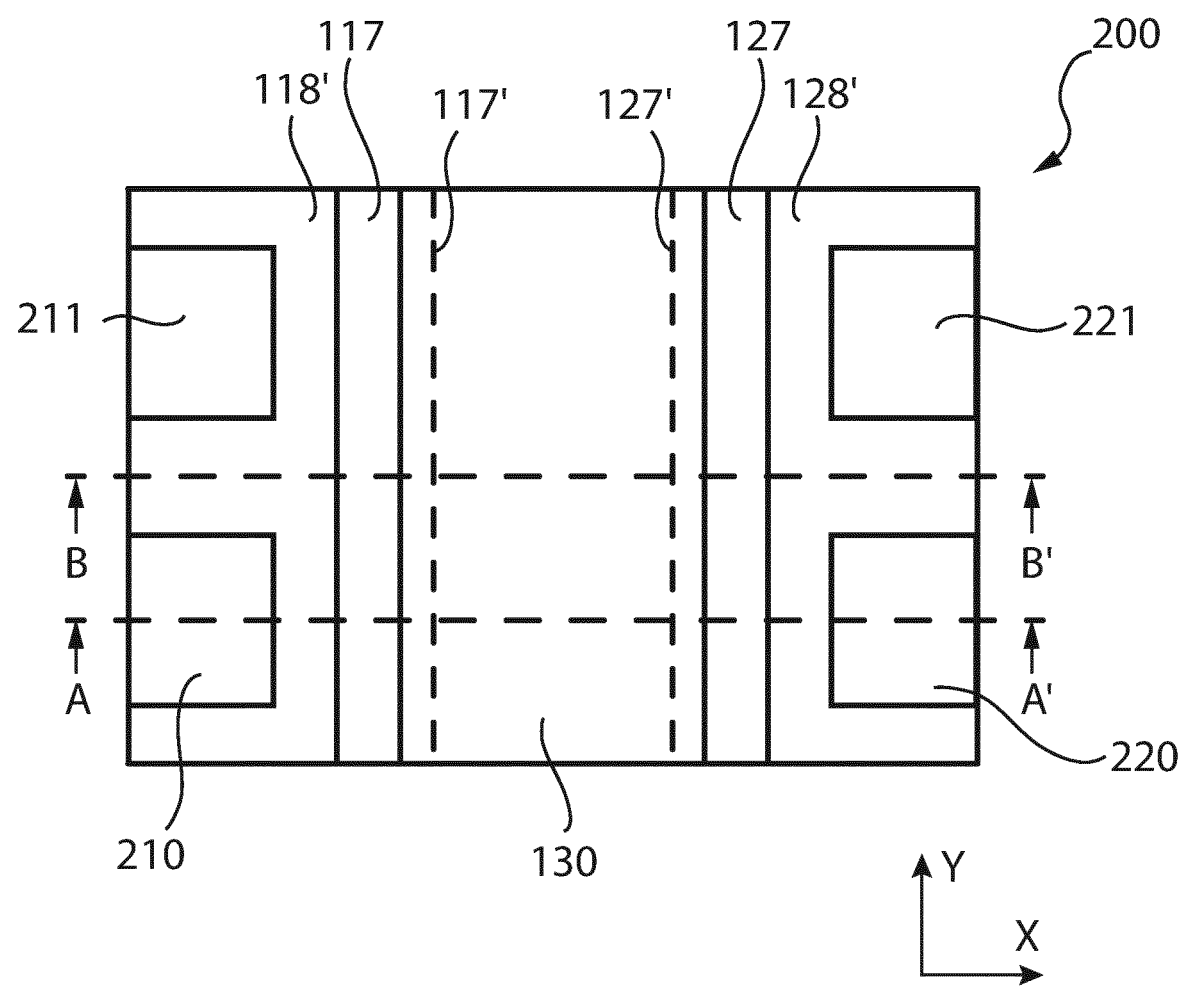
FIG. 2A shows a silicon carbide power device according to a second comparative example in top view.
Figure 2B:
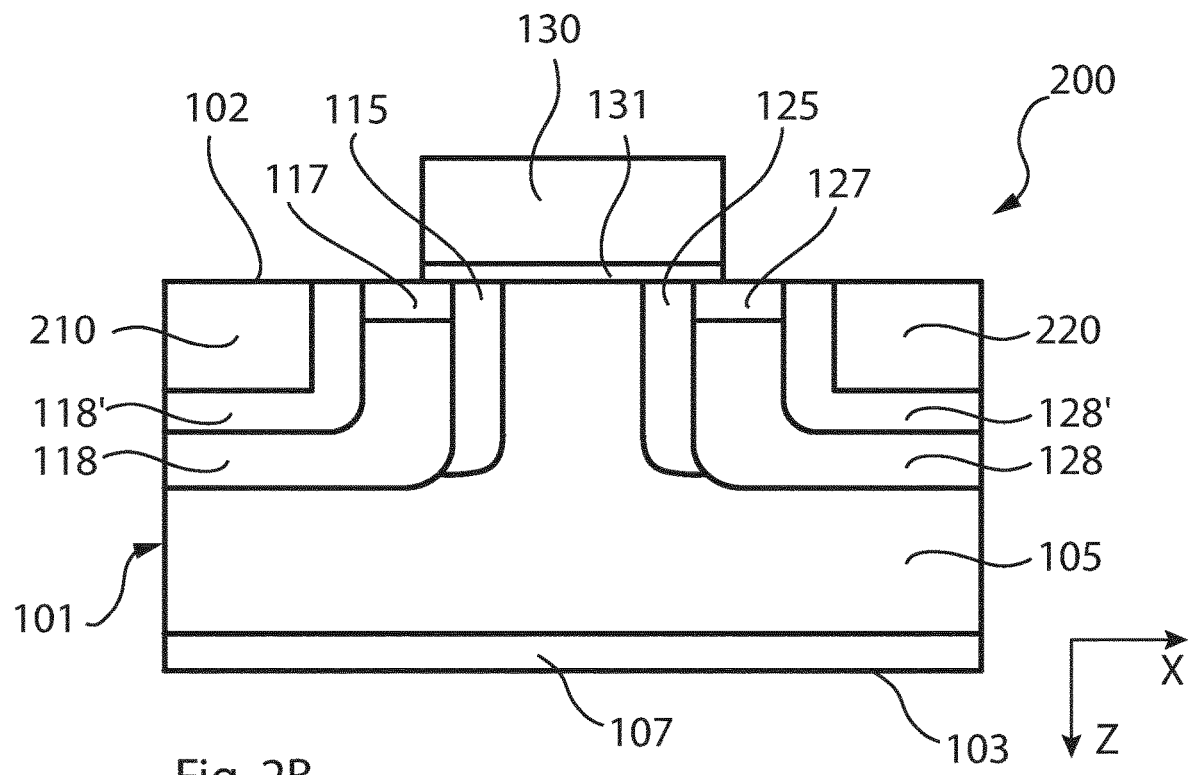
FIG. 2B shows the silicon carbide power device according to the second comparative example in a cross-section taken along line A-A' in FIG. 2A.
Figure 2C:
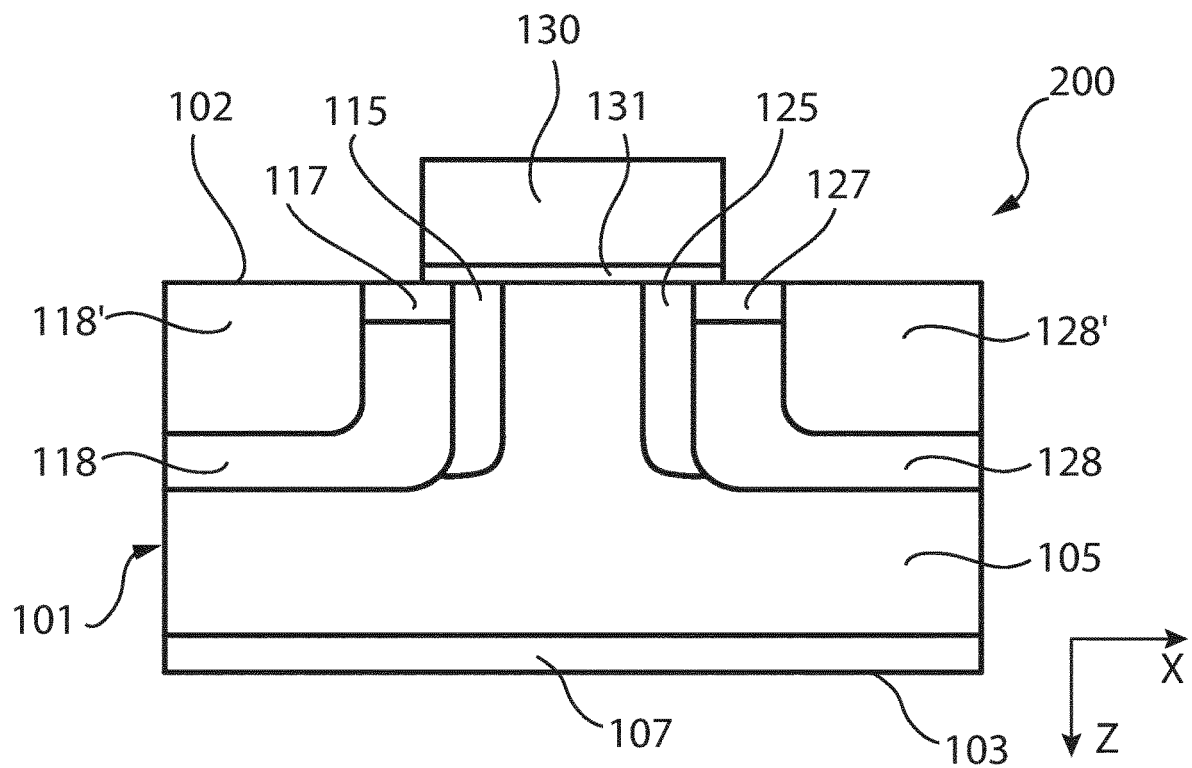
FIG. 2C shows the silicon carbide power device according to the second comparative example in a cross-section taken along line B-B' in FIG. 2A.

In the following a silicon carbide power device according to a second comparative example is described with reference to FIGS. 2A, 2B and 2C. FIG. 2A shows a top view of the vertical SiC MOSFET 200, FIG. 2B shows a cross-section taken along line A-A' in FIG. 2A, and FIG. 2C shows a cross-section taken along line B-B' in FIG. 2A. The silicon carbide power device according to the second comparative example is a vertical power MOSFET 200 that has a similar configuration as the vertical power MOSFET 100 described above. The vertical power MOSFET 200 differs from the vertical power MOSFET 100 only in that the above-described first and second stressors 110 and 120 are replaced with first to fourth stressors 210, 220, 211 and 221. Due to the many similarities only differences of the vertical power MOSFET 200 to the above-described vertical power MOSFET 100 are described in detail, whereas with regard to the remaining features it is referred to the description of the first comparative example above. In particular, reference signs that are identical in the figures of the first and second comparative example shall refer to elements that have the same characteristics. Accordingly, a repeated description of elements in the vertical power MOSFET 200 having the same reference signs as elements in the vertical power MOSFET 100 described above will not be described again. With regard to a description of elements indicated by these identical reference signs it is referred to the description of the first comparative example above.

Instead of having the first stressor 110 and the second stressor 120 as described above, the vertical power MOSFET 200 has four stressors 210, 220, 211 and 221. Like in the first comparative example above, the first source region 117, the first channel region 115, the first portion of the drift layer 105, the second channel region 125 and the first source region 125 are arranged between a first stressor 210 and a second stressor 220 in the first lateral direction X. In addition the vertical power MOSFET 200 comprises a third stressor 211 and a fourth stressor 221, which are basically identical to the first and the second stressors 210 and 220 but shifted from the first and the second stressors 210 and 220 in the second lateral direction. The first source region 117, the first channel region 115, the first portion of the drift layer 105, the second channel region 125 and the second source region 127 are laterally arranged between the third stressor 211 and the fourth stressor 221. The first stressor 210 and the third stressor 211 are both embedded in the first base layer 118 as a well region in the first p+-base layer portion 118, respectively. Likewise, the second stressor 220 and the fourth stressor 221 are both embedded in the second base layer 128 as a well region in the second p+-base layer portion 128, respectively. The arrangement of the first to fourth stressors 210, 220, 211 and 221 is such that there exists a mirror symmetry relative to a first symmetry plane perpendicular to the first main side 102 and extending in the middle between the first channel region 115 and the second channel region 125 parallel to the second lateral direction Y. In addition, there may exist another mirror symmetry also relative to a second mirror plane extending in the middle between the first stressor 210 and the second stressor 211 and extending in the middle between the second stressor 220 and the fourth stressor 221 perpendicular to the first main side 102 in a direction parallel to the first lateral direction X. A first distance of the first stressor 210 and a second distance of the third stressor 211 to the first channel region 115, respectively, are both exemplarily less than 10 μm or less than 5 μm or less than 2.5 μm. Likewise, a third distance from the second stressor 220 and a fourth distance of the fourth stressor 221 to the second channel region 125, respectively, is exemplarily less than 10 μm or less than 5 μm or less than 2.5 μm. Providing plural stressors 210, 211, 220, 211 on both sides of the strip-shaped gate electrode 130 has, compared to the configuration in the first comparative example where the first stressor 110 and the second stressor 120 are shaped in form of strips parallel to the strip-shaped gate layer 130, the advantage that a larger area of the first and second p+-base layer portions 118' and 128' is exposed on the first main side 102 to facilitate contact of these first and second p+-base layer portions 118' and 128' to source electrodes (not shown in the figures).

In other words the stressor configuration in the second comparative example differs from the stressor configuration in the first embodiment in that the single strip-shaped first stressor 110 continuously extending in the second lateral direction Y is replaced in the second comparative example with plural smaller stressors 210 and 211 aligned along the second lateral direction Y and in that the singly strip-shaped second stressor 120 continuously extending in the second lateral direction Y in the first comparative example is replaced in the second comparative example with plural smaller stressors 220 and 221 aligned along the second lateral direction Y. Each one of the first to fourth stressors 210, 220, 211 and 221 may extend from the first main side 102 to a depth of at least 50 nm, may each have a first lateral width in the first lateral direction X of at least 100 nm, and may each have a second width in the second lateral direction Y perpendicular to the first lateral direction X of at least 100 nm. Exemplarily, the first to fourth stressors 210, 211, 220, 221 may each extend from the first main side 102 to a depth of at least 100 nm or to a depth of at least 200 nm. More exemplarily, the first to fourth stressors 210, 211, 220, 221 may each may each have a first lateral width in the first lateral direction X of at least 100 nm or of at least 200 nm. Exemplarily, the first to fourth stressors 210, 211, 220, 221 may each may each have a second lateral width in the second lateral direction Y of at least 100 nm or of at least 200 nm. The material of the first to fourth stressors 210, 211, 220, 221 may the same as that described above for the first and second stressors 110 and 120 of the first comparative example. Like in the first comparative example the stress in the first channel region 115 is substantially aligned in a direction parallel to a direction of current flow through the first channel region 115 during operation of the vertical power MOSFET 200, i.e. parallel or anti-parallel to the first lateral direction X. Likewise, the stress in the second channel region 125 is substantially aligned in a direction parallel to a direction of current flow through the second channel region 215 during operation of the vertical power MOSFET 200, i.e. parallel or anti-parallel to the first lateral direction X.

Figure 3A:
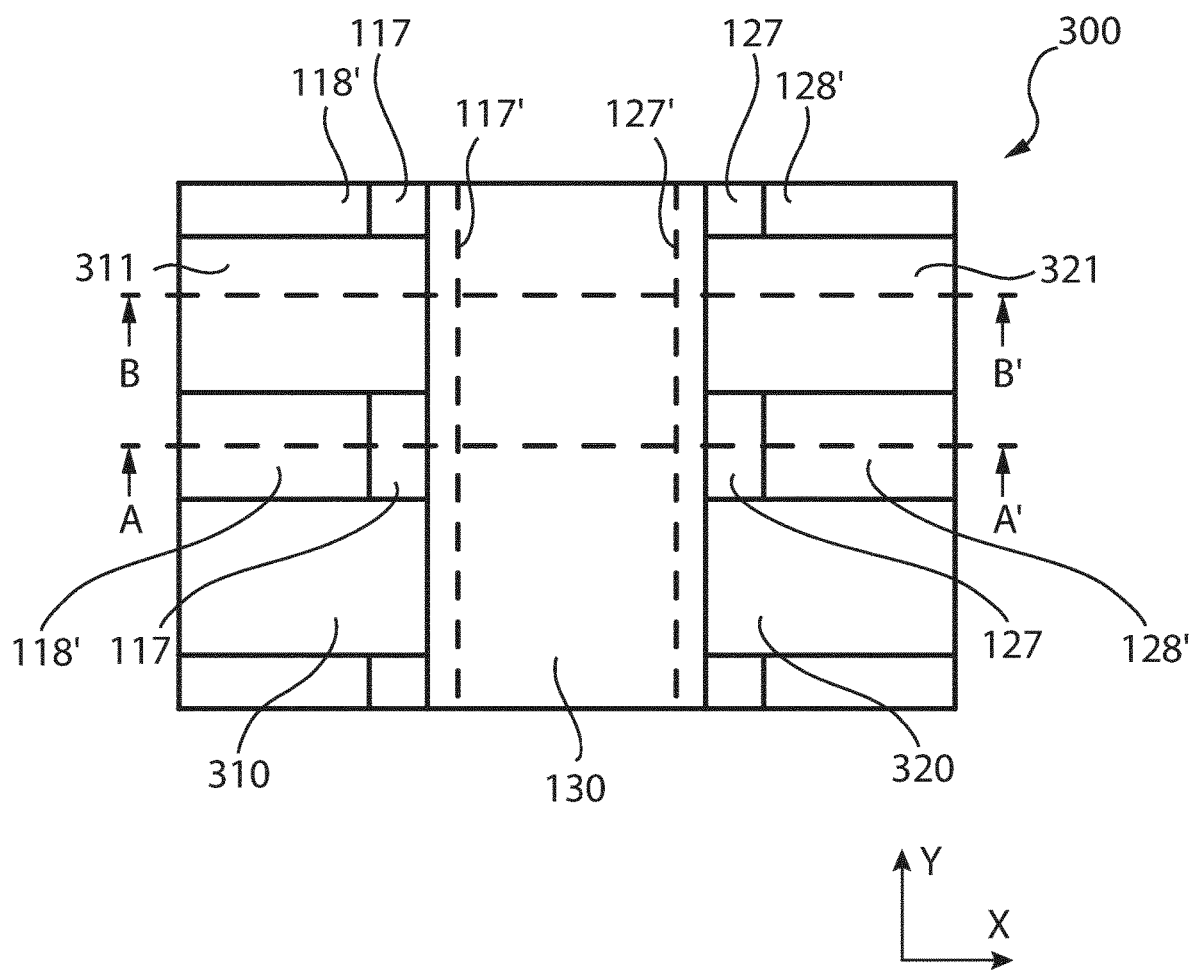
FIG. 3A shows a silicon carbide power device according to a third comparative example in top view.
Figure 3B:
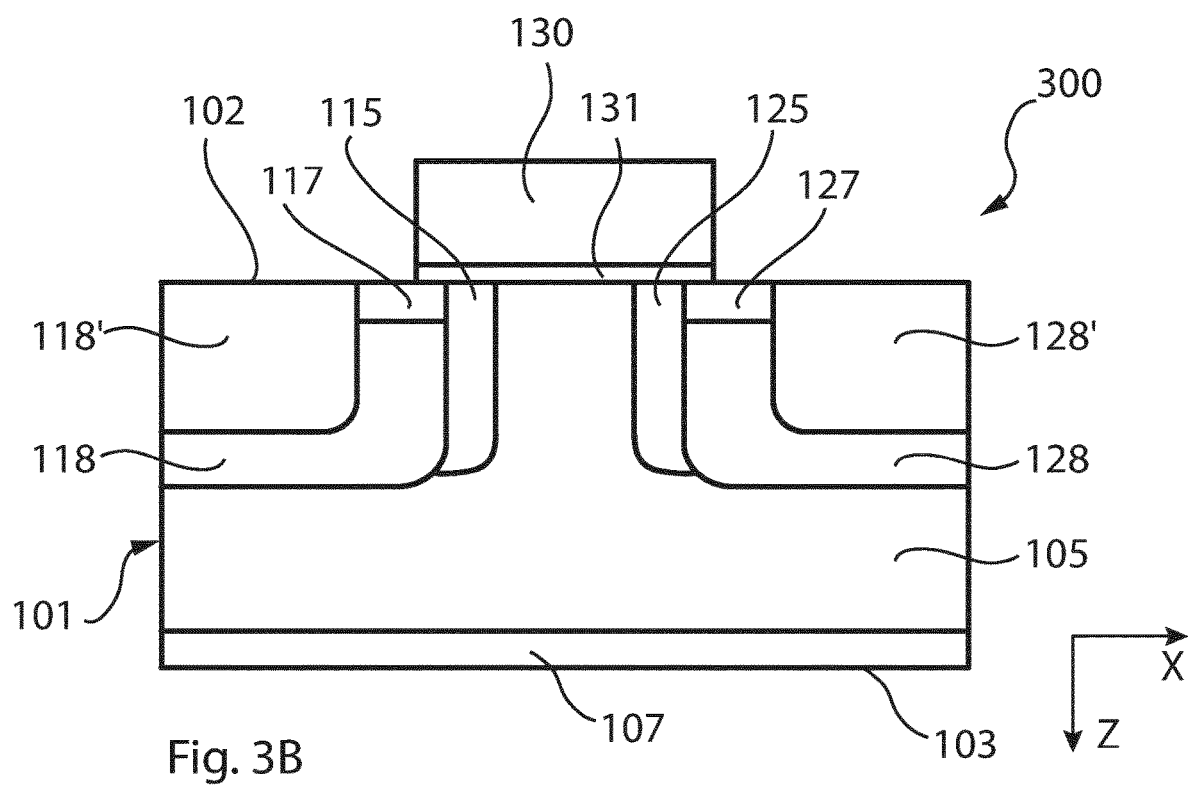
FIG. 3B shows the silicon carbide power device according to the third comparative example in a cross-section taken along line A-A' in FIG. 3A.
Figure 3C:
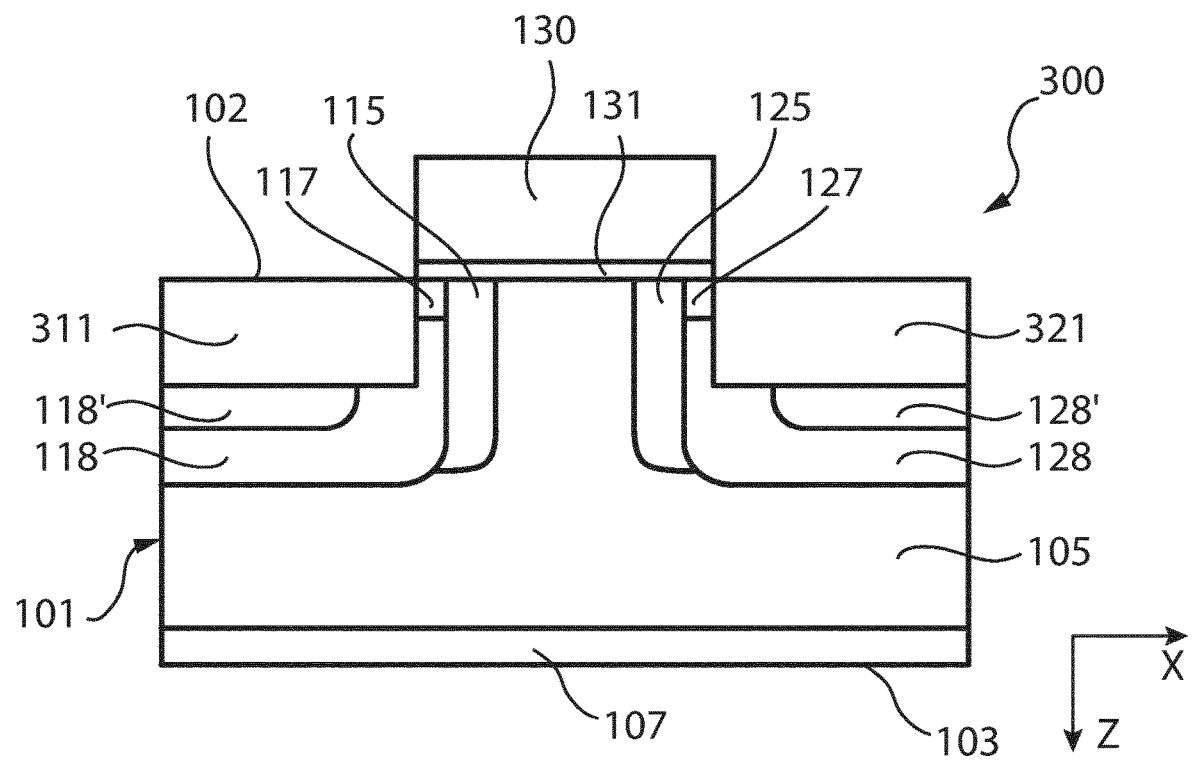
FIG. 3C shows the silicon carbide power device according to the third comparative example in a cross-section taken along line B-B' in FIG. 3A.

In the following a SiC power device according to a third comparative example will be described with reference to FIGS. 3A to 3C. The SiC power device according to the third comparative example is a vertical power MOSFET 300 which is similar to the power MOSFET 200 described above with reference to FIGS. 2A to 2C. Due to the many similarities between the second and the third comparative example only differences between these two comparative examples will be described in the following. FIG. 3A shows a top view of the vertical SiC MOSFET 300, FIG. 3B shows a cross-section taken along line A-A' in FIG. 3A, and FIG. 3C shows a cross-section taken along line B-B' in FIG. 3A. Same reference signs in the figures refer to the same elements as described above and it is referred to the above description in this respect. A repeated description of these elements will not be provided. The vertical power MOSFET 300 differs from the vertical power MOSFET 200 only in the configuration of stressors provided in the device. In the third comparative example shown in FIGS. 3A to 3C a first to fourth stressor 310, 320, 311 and 321 is provided, which differ from the first to fourth stressors 210, 220, 211 and 221 in the second comparative example only in that the first to fourth stressors 310, 320, 311 and 321 extend in the first lateral direction X up to an edge of the gate layer 130 in the top view shown in FIG. 3A. In all other aspects the first to fourth stressors 310, 320, 311 and 321 are identical to the first to fourth stressors 210, 220, 211 and 221 in the second comparative example described above. The first stressor 310 and the third stressor 311 are closer to the first channel region 115 than the first stressor 210 and the third stressor 211 in the second comparative example. Likewise, the second stressor 320 and the fourth stressor 321 are closer to the second channel region 125 than the second stressor 220 and the fourth stressor 221 are to the second channel region 125 in the second comparative example. Accordingly, a higher stress level can be introduced in the first and the second channel regions 115 and 125 by the first to fourth stressors 310, 320, 311 and 321 than in the second comparative example. Also the vertical power MOSFET 300 has the same mirror symmetries as the vertical power MOSFET 200. Like in the above comparative examples the stress in the first channel region 115 is substantially aligned in a direction parallel to a direction of current flow through the first channel region 115 during operation of the vertical power MOSFET 300, i.e. parallel or anti-parallel to the first lateral direction X. Likewise, the stress in the second channel region 125 is substantially aligned in a direction parallel to a direction of current flow through the second channel region 125 during operation of the vertical power MOSFET 300, i.e. parallel or anti-parallel to the first lateral direction X.

Figure 4A:
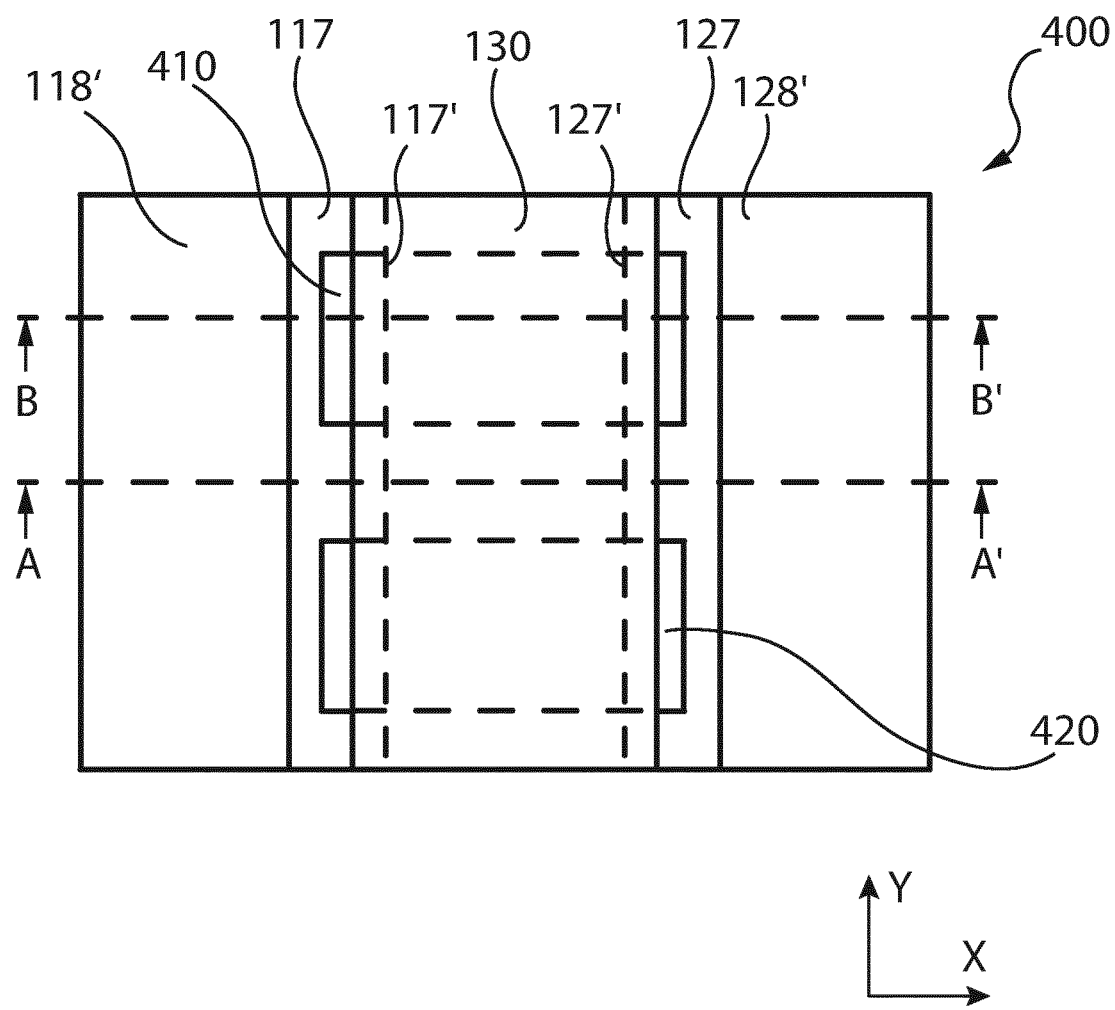
FIG. 4A shows a silicon carbide power device according to an embodiment in top view.
Figure 4B:
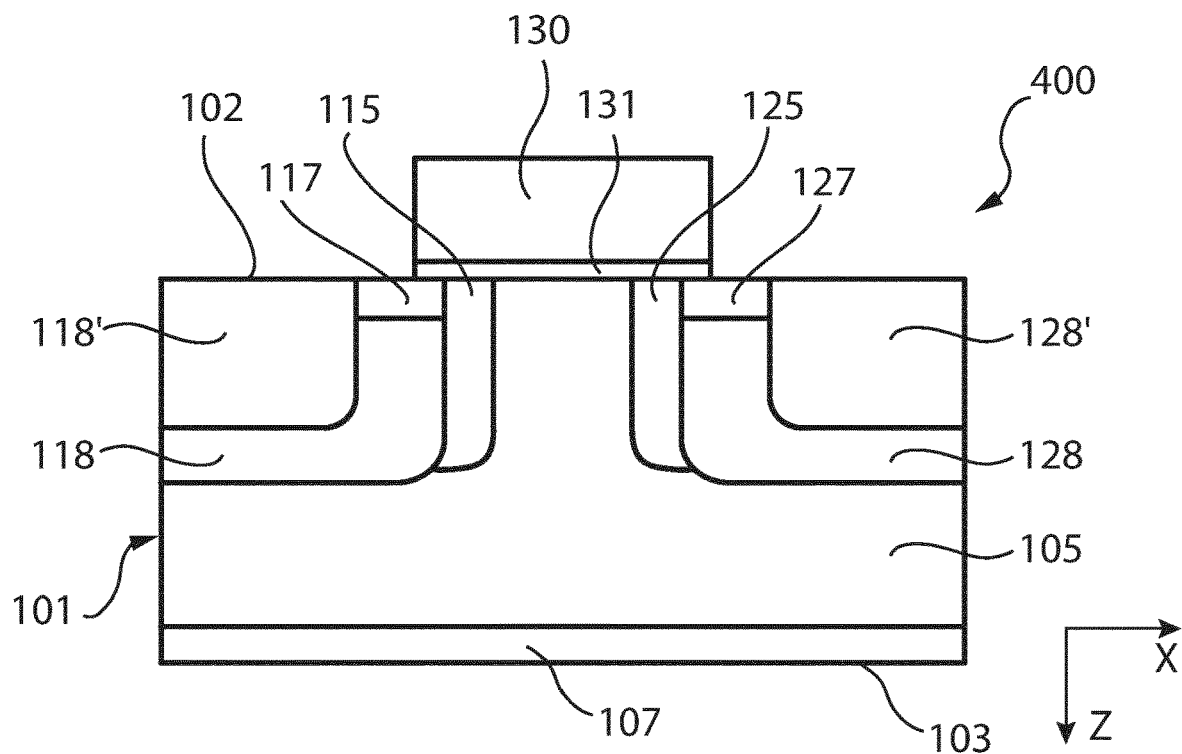
FIG. 4B shows the silicon carbide power device according to the embodiment in a cross-section taken along line A-A' in FIG. 4A.
Figure 4C:
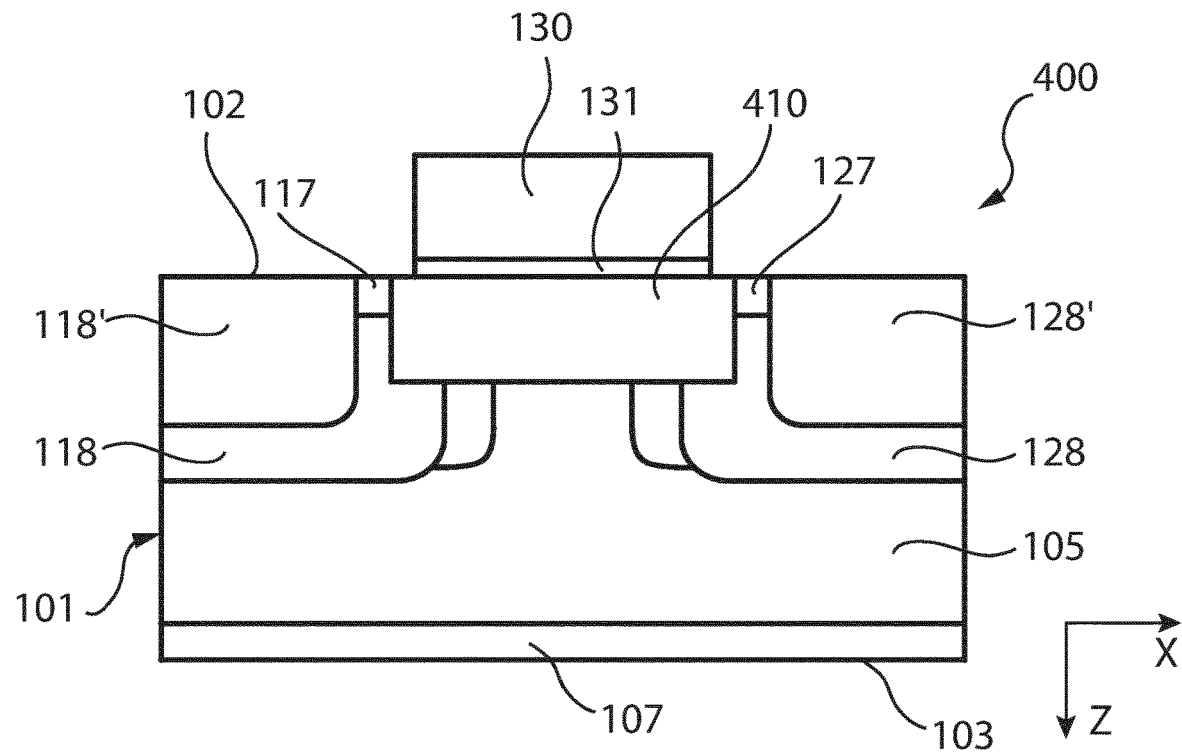
FIG. 4C shows the silicon carbide power device according to the embodiment in a cross-section taken along line B-B' in FIG. 4A.

In the following a SiC power device according to an embodiment of the claimed invention will be described with reference to FIGS. 4A to 4C. The SiC power device according to the embodiment is a vertical power MOSFET 400 which is similar to the vertical power MOSFETs 100 to 300 described above. FIG. 4A shows a top view of the vertical SiC MOSFET 400, FIG. 4B shows a cross-section taken along line A-A' in FIG. 4A, and FIG. 4C shows a cross-section taken along line B-B' in FIG. 4A. Same reference signs in the figures refer to the same elements as described above and it is referred to the above description in this respect. A repeated description of these elements will not be provided. The embodiment differs from the first to third comparative examples only in the configuration of stressors 410 and 420. With regard to all other features it is referred to the above description. In the embodiment the first stressor 410 and the second stressor 420 are arranged in the silicon carbide wafer 401 adjacent to the first main side 402 such that the first channel region 115, the first portion of the drift layer 105 and the second channel region 125 are laterally arranged in the second lateral direction between the first stressor 410 and the second stressor 420. That means while in the first (or second or third) comparative example described above the first and the second channel regions 115, 125 are sandwiched between the first stressor 110 (or 210 or 310) and the second stressor 120 (or 220 or 320) in the first lateral direction X, in the embodiment the first and the second channel regions 115, 125 are sandwiched between the first stressor 410 and the second stressor 420 in the second lateral direction Y. When viewed in the second lateral direction Y, i.e. in an orthogonal projection onto a plane perpendicular to the second lateral direction Y, the first stressor 410 and the second stressor 420 respectively overlap with the first source region 117, the first channel region 115, the first portion of the drift layer 105, the second channel region 125 and the second source region 127. In the embodiment the first and the second stressors 410 and 420 are both in direct contact with the first and the second channel regions 115 and 125. Accordingly, stress can be introduced in the first and the second channel regions 115 and 125 in the embodiment more efficiently than in the first to third comparative examples. Similar to the first to third comparative examples the arrangement of the first and second stressors 410 and 420 is such that there exists a mirror symmetry relative to a first symmetry plane perpendicular to the first main side 102 and extending in the middle between the first channel region 115 and the second channel region 125 in a direction parallel to the second lateral direction Y. In addition, there may exist another mirror symmetry relative to a second mirror plane extending in the middle between the first stressor 410 and the second stressor 420 perpendicular to the first main side 102 in a direction parallel to the first lateral direction X. Like in the above comparative examples the stress in the first channel region 115 is substantially aligned in a direction parallel to a direction of current flow through the first channel region 115 during operation of the vertical power MOSFET 400. Likewise, the stress in the second channel region 125 is substantially aligned in a direction parallel to a direction of current flow through the second channel region 115 during operation of the vertical power MOSFET 400.

Figure 5A:
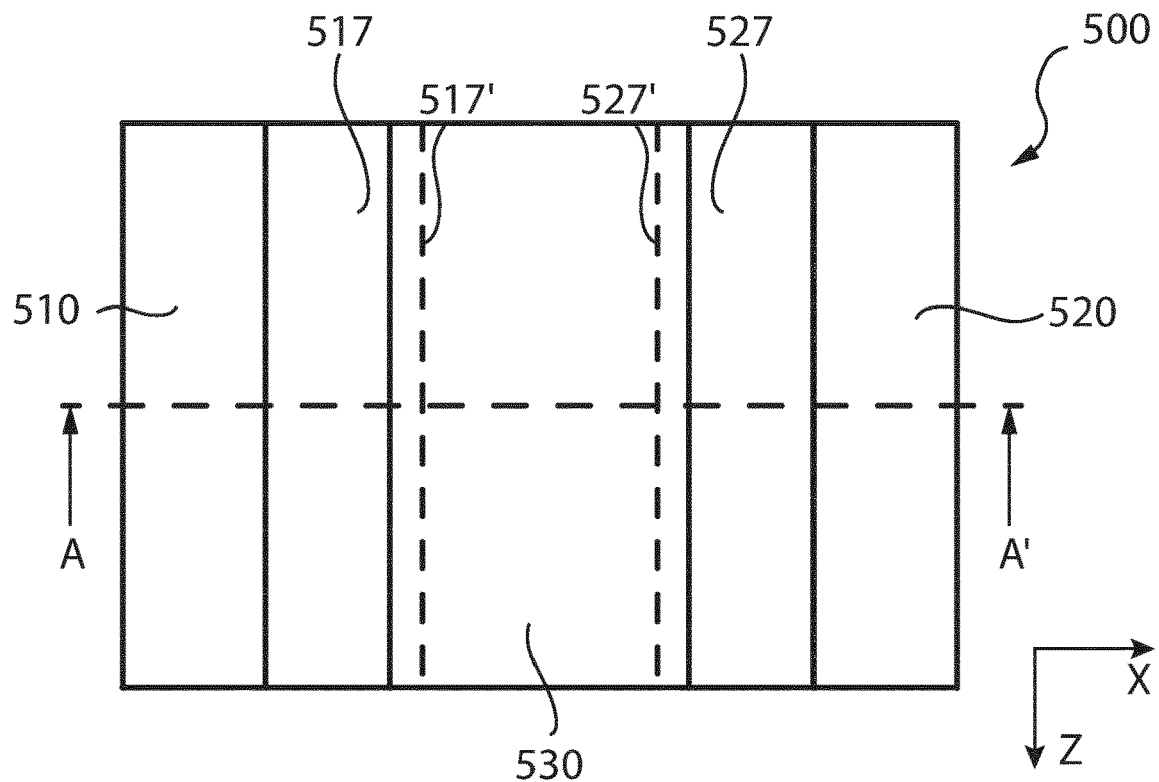
FIG. 5A shows a silicon carbide power device according to a fourth comparative example in top view.
Figure 5B:
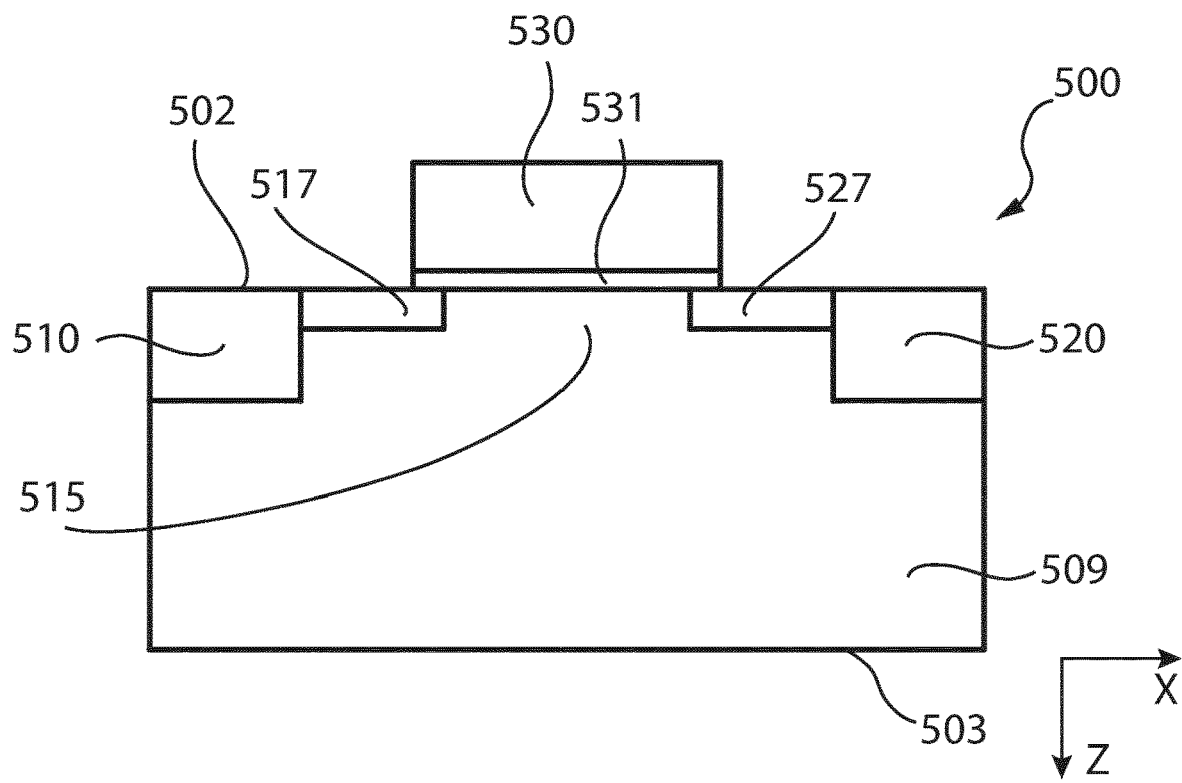
FIG. 5B shows the silicon carbide power device according to the fourth comparative example in a cross-section taken along line A-A' in FIG. 5A.

In the following a SiC power device according to a fourth comparative example will be described with reference to FIGS. 5A and 5B. The SiC power device according to the fourth comparative example is a lateral power MOSFET 500. FIG. 5A shows the lateral power MOSFET 500 in top view and FIG. 5B shows the lateral power MOSFET 500 in a cross-section taken along line A-A' in FIG. 5A. The lateral power MOSFET 500 comprises a SiC layer 509 having a first main side 502 and a second main side 503. Adjacent to the first main side 502 are formed an n-type source region 517 and an n-type drain region 527, which are laterally separated in a first lateral direction X parallel to the first main side 502 by a p-type channel region 515. On the first main side 502 there is formed a gate insulation layer 531 overlapping the channel region 515. On the gate insulation 531 there is formed a conductive gate layer 530. The source region 517, the drain region 527, the gate layer 530 and the channel region 515 sandwiched in the first lateral direction X between the source region 517 and the drain region 527 are all strip-shaped with a longitudinal axis extending in a second lateral direction Y perpendicular to the first lateral direction X and parallel to the first main side 502 as shown in FIG. 5B in top view, i.e. in an orthogonal projection onto a plane parallel to the first main side 502.

The lateral power MOSFET 500 according to the fourth comparative example includes a first stressor 510 and a second stressor 520 which are arranged adjacent to the first main side 502 in the SiC layer 509. The first stressor 510 and the second stressor 520 are also strip-shaped and extend in the first lateral direction X parallel to the longitudinal axis of the strip-shaped first source region 517, the longitudinal axis of the strip-shaped gate layer 530 and the longitudinal axis of the strip-shaped drain region 527. The first stressor 510 is arranged on a first side of the gate layer 530 in the first lateral direction X, whereas the second stressor 520 is arranged on a second side of the gate layer 530 opposite to the first side. The source region 517, the channel region 515 and the drain region 527 are laterally arranged between the first stressor 510 and the second stressor 520. The first stressor 510 and the second stressor 520 are configured to introduce stress in the channel region 515. The first stressor 510 and the second stressor 520 are connected to the channel region 515 by a continuous SiC region, namely by a portion of the SiC layer 509 including the source region 517 and the drain region 527. Regarding the size and the material, the first stressor 510 and the second stressor 520 may have the same features as the first stressor 110 and the second stressor 120 described above with reference to FIGS. 1A and 1B. Like in the above embodiment and fourth comparative examples the stress in the channel region 515 is substantially aligned in a direction parallel to a direction of current flow through the channel region 515 during operation of the lateral power MOSFET 500, i.e. parallel or anti-parallel to the first lateral direction X.

It will be apparent for persons skilled in the art that modifications of the above described embodiment are possible without departing from the scope of the invention as defined by the appended claims.

In the above embodiment the silicon carbide power device was described to be a vertical power MOSFET. However, the concept of the invention may also be applied to an insulated gate bipolar thyristor (IGBT).

In the above embodiments, the stress applied to the channel region(s) was described to be a tensile stress, but it may also be a compressive stress.

It should be noted that the term "comprising" does not exclude other elements or steps and that the indefinite article "a" or "an" does not exclude the plural. Also elements described in association with different embodiments may be combined.

LIST OF REFERENCE SIGNS 100, 200, 300, 400 vertical power MOSFET
101 silicon carbide wafer
102, 502 first main side
103, 503 second main side
105 drift layer
107 drain layer 115 first channel region
117 first source region
118 first base layer
118' first p+ base layer portion
110, 210, 310, 410, 510 first stressor
120, 220, 320, 420, 520 second stressor
125 second channel region
127 second source region
128 second base layer
128' second p+ base layer portion
130, 530 gate layer
131, 531 gate insulation layer
211, 311 third stressor
221, 321 fourth stressor
500 lateral power MOSFET
509 SiC layer
515 channel region
517 source region
527 drain region
X first lateral direction
Y second lateral direction
Z orthogonal direction

The invention claimed is:

1. A silicon carbide power device, wherein the silicon carbide power device is a vertical power MOSFET or an IGBT and comprises a silicon carbide wafer having a first main side and a second main side opposite to the first main side, the silicon carbide wafer comprising:
a first channel region of a first conductivity type;
a first source region of a second conductivity type different from the first conductivity type, wherein the first source region is arranged on a first lateral side of the first channel region in a first lateral direction parallel to the first main side;
a drift layer of the second conductivity type, a first portion of the drift layer being arranged on a second lateral side of the first channel region, wherein the second lateral side is opposite to the first lateral side and wherein a second portion of the drift layer-extends from the first portion towards the second main side;
a first base layer of the first conductivity type separating the first source region from the drift layer;
a second channel region of the first conductivity type arranged on the second lateral side of the first channel region and laterally separated from the first channel region by the first portion of the drift layer;
a second source region of the second conductivity type, wherein the second source region and the first portion of the drift layer are arranged on opposite lateral sides of the second channel region;
a second base layer of the first conductivity type separating the second source region from the drift layer;
a gate insulation layer arranged to extend on the first main side to overlap the first channel region and the second channel region, wherein the gate insulation layer is directly on the first channel region and on the second channel region;
a conductive gate layer directly on the gate insulation layer, so that the gate layer is separated from the first channel region and from the second channel region by the gate insulation layer;
a first stressor arranged in the silicon carbide wafer at the first main side; and
a second stressor arranged in the silicon carbide wafer at the first main side, wherein the first channel region, the first portion of the drift layer and the second channel region are laterally arranged between the first stressor and the second stressor in a second lateral direction parallel to the first main side and perpendicular to the first lateral direction, such that a stress is introduced by the first stressor and the second stressor in the first channel region and in the second channel region.

2. A silicon carbide power device, wherein the silicon carbide power device is a vertical power MOSFET or an IGBT and comprises a silicon carbide wafer having a first main side and a second main side opposite to the first main side, the silicon carbide wafer comprising:
a first channel region of a first conductivity type;
a first source region of a second conductivity type different from the first conductivity type, wherein the first source region is arranged on a first lateral side of the first channel region in a first lateral direction parallel to the first main side;
a drift layer of the second conductivity type, a first portion of the drift layer being arranged on a second lateral side of the first channel region, wherein the second lateral side is opposite to the first lateral side and wherein a second portion of the drift layer extends from the first portion towards the second main side;
a first base layer of the first conductivity type separating the first source region from the drift layer;
a second channel region of the first conductivity type arranged on the second lateral side of the first channel region and laterally separated from the first channel region by the first portion of the drift layer;
a second source region of the second conductivity type, wherein the second source region and the first portion of the drift layer are arranged on opposite lateral sides of the second channel region;
a second base layer of the first conductivity type separating the second source region from the drift layer;
a gate insulation layer arranged to extend on the first main side to overlap the first channel region and the second channel region, wherein the gate insulation layer is directly on the first channel region and on the second channel region and wherein the gate insulation layer is a silicon oxide layer;
a conductive gate layer directly on the gate insulation layer, so that the gate layer is separated from the first channel region and from the second channel region by the gate insulation layer;
a first stressor arranged in the silicon carbide wafer at the first main side; and
a second stressor arranged in the silicon carbide wafer at the first main side, wherein the first channel region, the first portion of the drift layer and the second channel region are laterally arranged between the first stressor and the second stressor in a second lateral direction parallel to the first main side and perpendicular to the first lateral direction, such that a stress is introduced by the first stressor and the second stressor in the first channel region and in the second channel region.

3. The silicon carbide power device according to claim 1, wherein the first stressor is in direct contact with the first channel region.

4. The silicon carbide power device according to claim 1, wherein the first stressor comprises an oxide.

5. A silicon carbide power device, wherein the silicon carbide power device is a vertical power MOSFET or an IGBT and comprises a silicon carbide wafer having a first main side and a second main side opposite to the first main side, the silicon carbide wafer comprising:
a first channel region of a first conductivity type;

a first source region of a second conductivity type different from the first conductivity type, wherein the first source region is arranged on a first lateral side of the first channel region in a first lateral direction parallel to the first main side;
a drift layer of the second conductivity type, a first portion of the drift layer being arranged on a second lateral side of the first channel region, wherein the second lateral side is opposite to the first lateral side and wherein a second portion of the drift layer extends from the first portion towards the second main side;
a first base layer of the first conductivity type separating the first source region from the drift layer;
a second channel region of the first conductivity type arranged on the second lateral side of the first channel region and laterally separated from the first channel region by the first portion of the drift layer;
a second source region of the second conductivity type, wherein the second source region and the first portion of the drift layer are arranged on opposite lateral sides of the second channel region;
a second base layer of the first conductivity type separating the second source region from the drift layer;
a gate insulation layer arranged to extend on the first main side to overlap the first channel region and the second channel region, wherein the gate insulation layer is directly on the first channel region and on the second channel region;
a conductive gate layer directly on the gate insulation layer, so that the gate layer is separated from the first channel region and from the second channel region by the gate insulation layer;
a first stressor arranged in the silicon carbide wafer at the first main side, wherein the first stressor is electrically non-conductive; and a second stressor arranged in the silicon carbide wafer at the first main side, wherein the first channel region, the first portion of the drift layer and the second channel region are laterally arranged between the first stressor and the second stressor in a second lateral direction parallel to the first main side and perpendicular to the first lateral direction, such that a stress is introduced by the first stressor and the second stressor in the first channel region and in the second channel region.

6. The silicon carbide power device according to claim 1, wherein the stress in the first channel region has an absolute value that is at least 0.5 GPa.

7. The silicon carbide power device according to claim 1, wherein a distance between the first stressor and the first channel region is less than 10 µm or less than 5 µm.

8. The silicon carbide power device according to claim 1, wherein the first stressor extends from the first main side to a depth of at least 50 nm, extends at least 100 nm in the first lateral direction and extends at least 100 nm in the second lateral direction perpendicular to the first lateral direction.

9. The silicon carbide power device according to claim 1, wherein the first stressor and the second stressor are in direct contact with the first channel region, the first portion of the drift layer and the second channel region.

10. The silicon carbide power device according to claim 1, wherein the first channel region, the second channel region, the first stressor and the second stressor are arranged in a configuration with mirror symmetry relative to a plane perpendicular to the first main side and extending between the first channel region and the second channel region.

11. The silicon carbide power device according to claim 1, wherein the first stressor is connected to the first channel region by a continuous silicon carbide region.

12. The silicon carbide power device according to claim 1, wherein the first stressor comprises a nitride.

13. The silicon carbide power device according to claim 12, wherein the first stressor comprises silicon nitride.

14. The silicon carbide power device according to claim 12, wherein the first stressor comprises aluminum nitride.

15. The silicon carbide power device according to claim 1, wherein the first stressor comprises a ceramic compound.

16. The silicon carbide power device according to claim 6, wherein the stress in the first channel region has an absolute value that is at least 0.7 GPa.

17. The silicon carbide power device according to claim 7, wherein a distance between the first stressor and the first channel region is less than 5 µm.

18. The silicon carbide power device according to claim 17, wherein a distance between the first stressor and the first channel region is less than 2.5 µm.

* * * * *

UNITED STATES PATENT AND TRADEMARK OFFICE
CERTIFICATE OF CORRECTION

PATENT NO. : 11,302,811 B2
APPLICATION NO. : 17/416294
DATED : April 12, 2022
INVENTOR(S) : Bellini et al.

It is certified that error appears in the above-identified patent and that said Letters Patent is hereby corrected as shown below:

In the Claims

Claim 7, Column 16, Line 6; delete "or less than 5µm".

Signed and Sealed this
Seventeenth Day of May, 2022

*Katherine Kelly Vidal*

Katherine Kelly Vidal
*Director of the United States Patent and Trademark Office*